United States Patent
Goda

(10) Patent No.: US 11,527,743 B2
(45) Date of Patent: Dec. 13, 2022

(54) ORGANIC ELECTRONIC DEVICE MANUFACTURING METHOD

(71) Applicant: SUMITOMO CHEMICAL COMPANY, LIMITED, Tokyo (JP)

(72) Inventor: Tadashi Goda, Niihama (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 270 days.

(21) Appl. No.: 16/756,313

(22) PCT Filed: Oct. 11, 2018

(86) PCT No.: PCT/JP2018/037949
§ 371 (c)(1),
(2) Date: Apr. 15, 2020

(87) PCT Pub. No.: WO2019/078085
PCT Pub. Date: Apr. 25, 2019

(65) Prior Publication Data
US 2020/0243804 A1    Jul. 30, 2020

(30) Foreign Application Priority Data

Oct. 19, 2017  (JP) .............................. JP2017-202675

(51) Int. Cl.
*H01L 51/00* (2006.01)
*H01L 51/50* (2006.01)
*H01L 51/56* (2006.01)

(52) U.S. Cl.
CPC .......... *H01L 51/56* (2013.01); *H01L 51/0005* (2013.01); *H01L 51/0007* (2013.01); *H01L 51/0031* (2013.01); *H01L 51/5012* (2013.01)

(58) Field of Classification Search
CPC . H01L 51/56; H01L 51/0005; H01L 51/0007; H01L 51/0031; H01L 51/5012
See application file for complete search history.

(56) References Cited

U.S. PATENT DOCUMENTS

2006/0247132 A1    11/2006   Newsome et al.
2007/0092988 A1    4/2007    Brabec et al.
(Continued)

FOREIGN PATENT DOCUMENTS

CN    105489781 A    4/2016
EP    2 315 291 A1   4/2011
(Continued)

OTHER PUBLICATIONS

Extended European Search Report for European Application No. 18868422.9, dated Jun. 24, 2021.
(Continued)

*Primary Examiner* — David Vu
*Assistant Examiner* — Brandon C Fox
(74) *Attorney, Agent, or Firm* — Birch, Stewart, Kolasch & Birch, LLP

(57) ABSTRACT

According to an embodiment, a method of manufacturing an organic electronic device including a stack including a first electrode layer, one or more functional layers, and a second electrode layer, the one or more functional layers and the second electrode layer being formed in this order on the first electrode layer, comprises: a first layer forming step of forming a first layer 24 among the layers included in the stack; and a second layer forming step of forming a second layer on the first layer by using a coating solution containing a material for the second layer and a solvent with boiling point of 160° C. or more, the second layer being in contact with the first layer. In the first layer forming step, the first layer is formed with a thickness t smaller than a desired thickness such that the first layer has the desired thickness T due to an increase in a thickness of the first layer as the second layer is formed.

8 Claims, 7 Drawing Sheets

(56) References Cited

U.S. PATENT DOCUMENTS

| | | | | |
|---|---|---|---|---|
| 2011/0114926 A1* | 5/2011 | Okabe | ................ | H01L 51/5048 |
| | | | | 257/E51.027 |
| 2015/0270485 A1 | 9/2015 | Watanabe | | |
| 2017/0117471 A1* | 4/2017 | Takata | ................... | H01L 51/56 |
| 2018/0062034 A1 | 3/2018 | He et al. | | |
| 2018/0062078 A1* | 3/2018 | Watanabe | .............. | C09D 11/52 |
| 2020/0291251 A1* | 9/2020 | Pan | ..................... | C09D 11/033 |

FOREIGN PATENT DOCUMENTS

| | | |
|---|---|---|
| JP | 2000-323276 A | 11/2000 |
| JP | 2006-332636 A | 12/2006 |
| JP | 2008-294401 A | 12/2008 |
| JP | 2009-514184 A | 4/2009 |
| JP | 2014-29875 A | 2/2014 |

OTHER PUBLICATIONS

Japanese Office Action for Japanese Application No. 2017-202675, dated Apr. 6, 2021, with an English translation.
Japanese Office Action for Japanese Application No. 2017-202675, dated Oct. 5, 2021, with English translation.
International Preliminary Report on Patentability and the Written Opinion of the International Searching Authority for International Application No. PCT/JP2018/037949, dated Apr. 30, 2020.
International Search Report dated Dec. 25, 2018, for International Application No. PCT/JP2018/037949.

* cited by examiner

ORGANIC ELECTRONIC DEVICE MANUFACTURING METHOD

TECHNICAL FIELD

The present invention relates to a method of manufacturing an organic electronic device.

BACKGROUND ART

Examples of a technique in the technical field include a technique disclosed in Patent Literature 1. Patent Literature 1 discloses a method of manufacturing an organic EL device which is an example of an organic electronic device. Specifically, Patent Literature 1 discloses a method of manufacturing an organic EL device in which a hole injection layer and a light emitting layer being two adjacent functional layers are sandwiched between an anode and a cathode. In the manufacturing of the organic EL device according to the technique disclosed in Patent Literature 1, the light emitting layer is formed on the hole injection layer by an inkjet printing method after the hole injection layer is formed.

CITATION LIST

Patent Literature

Patent Literature 1: Japanese Unexamined Patent Publication No. 2000-323276

SUMMARY OF INVENTION

Technical Problem

When an organic electronic device is manufactured, a thickness of each layer is designed so that the organic electronic device can achieve desired performance, and each layer is formed with a thickness of a design value. However, desired performance can hardly be achieved when a layer to be formed later of two stacked layers in the organic electronic device is formed by using a coating solution containing a solvent with boiling point of 160° C. or more.

Accordingly, an object of the present invention is to provide a method of manufacturing an organic electronic device capable of achieving desired performance.

Solution to Problem

The inventors of the present invention have intensively studied to solve the above problem. As a result, the inventors have found that when a layer (hereinafter, referred to as a "second layer") to be formed later of two stacked layers is formed by using a coating solution containing a solvent with boiling point of 160° C. or more, the solvent permeates into a layer formed previously (hereinafter, referred to as a "first layer") and a thickness of the first layer deviates from a design value, and have made the present invention.

An aspect of the present invention is a method of manufacturing an organic electronic device including a stack including a first electrode layer, one or more functional layers, and a second electrode layer, the one or more functional layers and the second electrode layer being formed in this order on the first electrode layer, and the method comprises: a first layer forming step of forming a first layer among the layers included in the stack; and a second layer forming step of forming a second layer on the first layer by using a coating solution containing a material for the second layer and a solvent with boiling point of 160° C. or more, the second layer being in contact with the first layer. In the first layer forming step, the first layer is formed with a thickness smaller than a desired thickness such that the first layer has the desired thickness due to an increase in a thickness of the first layer as the second layer is formed.

The coating solution containing the solvent with boiling point of 160° C. or more tends to have a long drying time. As a result, the time during which the solvent stays on the first layer becomes longer, and the thickness of the first layer is likely to change. However, in the first layer forming step included in the manufacturing method, the first layer is formed with the thickness smaller than the desired thickness such that the first layer has the desired thickness due to the increase in the thickness of the first layer as the second layer is formed. Therefore, even when the second layer forming step of forming the second layer using the coating solution containing the solvent with boiling point of 160° C. or more is performed, the first layer in the manufactured organic electronic device can have the desired thickness. Therefore, according to the manufacturing method described above, it is possible to manufacture the organic electronic device capable of achieving the desired performance.

At least one of the one or more functional layers may be the first layer. The change in the thickness of the functional layer tends to affect the performance of the organic electronic device. Therefore, when at least one functional layer of the one or more functional layers is the first layer, the method of manufacturing the organic electronic device including the first layer forming step and the second layer forming step is effective.

The second layer may be formed by using an inkjet printing method in the second layer forming step. It is preferable to use the coating solution containing the solvent with boiling point of 160° C. or more in the inkjet printing method in order to prevent clogging of an inkjet nozzle. Therefore, the manufacturing method is effective when the second layer is formed by the inkjet printing method.

The method of manufacturing an organic electronic device according to an embodiment may further comprise a preparation step of optimizing the thickness of the first layer formed in the first layer forming step, and in the first layer forming step, the first layer may be formed with the thickness of the first layer optimized in the preparation step. In this case, since the first layer is formed in the first layer forming step with the thickness of the first layer optimized in the preparation step, the organic electronic device including the first layer of the desired thickness is easily manufactured.

The preparation step may include: a first prototype layer forming step of forming a first prototype layer by using the same material as the first layer; a second prototype layer forming step of forming a second prototype layer on the first prototype layer with the coating solution; and a determination step of determining whether the first prototype layer has the desired thickness after the second prototype layer forming step, the first prototype layer forming step and the second prototype layer forming step being repeated while changing a thickness of the first prototype layer formed in the first prototype layer forming step until the first prototype layer has the desired thickness as a result of the determination step.

Alternatively, the preparation step may include: a first prototype layer forming step of forming a first prototype layer by using the same material as the first layer; a second prototype layer forming step of forming a second prototype layer on the first prototype layer with the coating solution;

and a calculation step of calculating the thickness of the first layer to be formed in the first layer forming step with respect to the desired thickness, based on a thickness change rate of the first prototype layer calculated based on a thickness of the first prototype layer formed in the first prototype layer forming step and a thickness of the first prototype layer after the second prototype layer forming step.

When the preparation step includes the first prototype layer forming step, the second prototype layer forming step, and the determination step or the calculation step as described above, the optimum thickness of the first layer can be experimentally obtained. Therefore, the organic electronic device including the first layer of the desired thickness is easily manufactured.

The desired thickness may have a design value of the first layer in a case where the second layer is formed by using a coating solution containing the material for the second layer and a solvent with boiling point of less than 160° C. The coating solution in which the boiling point of the solvent is less than 160° C. is easily dried immediately after coating, and the phenomenon that the thickness of the first layer changes with the formation of the second layer hardly occurs. Therefore, the design value of the first layer, in a case where the second layer is formed by using the coating solution in which the boiling point of the solvent is less than 160° C., can be used as a desired thickness.

One of the plurality of functional layers may be a light emitting layer, and the desired thickness may be a thickness at which a desired light-emitting efficiency is obtained when the second layer is formed by using a coating solution containing the material for the second layer and a solvent with boiling point of less than 160° C. In this case, it is possible to manufacture the organic EL device, which is an example of the organic electronic device, in such a way as to achieve a desired light-emitting efficiency.

The method of manufacturing an organic electronic device according to an embodiment may further comprise: a device function portion forming step of forming a device function portion on the first electrode layer by forming the one or more functional layers on the first electrode layer formed on a substrate; and a second electrode layer forming step of forming the second electrode layer on the device function portion, and the device function portion forming step may include the first layer forming step and the second layer forming step.

The method of manufacturing an organic electronic device according to an embodiment may further comprise: a product manufacturing step of manufacturing an organic electronic device as a product, the product manufacturing step including the first layer forming step and the second layer forming step; a test product manufacturing step of manufacturing, before the product manufacturing step, a plurality of test organic electronic devices under the same conditions as in the product manufacturing step except that a thickness of a corresponding layer corresponding to the first layer formed in the first layer forming step is changed; and an evaluation step of evaluating, before the product manufacturing step, the plurality of test organic electronic devices. The one or more functional layers may be a light emitting layer. In the evaluation step, light-emitting efficiencies of the plurality of test organic electronic devices may be evaluated. In the product manufacturing step, the first layer forming step may be performed with the thickness of the corresponding layer used for manufacturing a test organic electronic device in which a desired light-emitting efficiency is obtained from among the plurality of test organic electronic devices in the evaluation step. In this case, it is possible to manufacture the organic EL device, which is an example of the organic electronic device, in such a way as to achieve a desired light-emitting efficiency.

Advantageous Effects of Invention

According to the present invention, it is possible to provide a method of manufacturing an organic electronic device capable of achieving desired performance.

DESCRIPTION OF EMBODIMENTS

Figure 1:
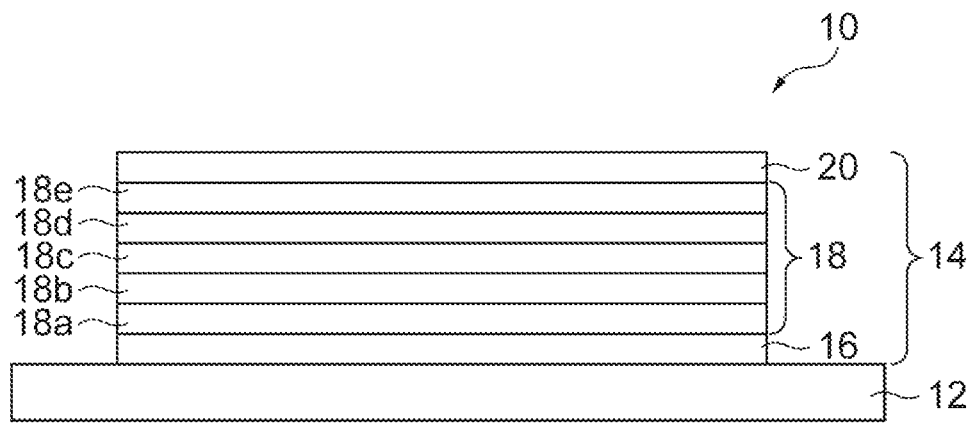
FIG. 1 is a schematic diagram for illustrating a schematic configuration of an organic EL device manufactured by a method of manufacturing an organic electronic device according to an embodiment.

An embodiment of the present invention will be described below with reference to the drawings. The same components are denoted by the same reference numerals, and the repeated description will not be presented. Dimensional ratios in the drawings are not necessarily consistent with their descriptions.

FIG. 1 is a schematic diagram for illustrating a schematic configuration of an organic electroluminescence device (organic EL device) 10 manufactured by a method of manufacturing an organic electronic device according to an embodiment. In the present embodiment, a bottom emission type organic EL device 10 will be described, but the organic EL device 10 may be a top emission type. The organic EL device 10 includes a substrate 12 and a stack 14 provided on the substrate 12.

[Substrate]

The substrate 12 has a property of transmitting light (including visible light having a wavelength of 400 nm to 800 nm) emitted from the organic EL device 10. A thickness of the substrate 12 is, for example, 30 μm to 700 μm.

The substrate 12 may be a rigid substrate such as a glass substrate or a silicon substrate, or may be a flexible substrate such as a plastic substrate or a polymer film. A barrier layer having a moisture barrier function may be formed on the substrate 12. The barrier layer may have a barrier function of a gas (for example, oxygen) in addition to the moisture barrier function.

[Stack]

The stack 14 includes an anode layer (first electrode layer) 16, and an organic EL portion (device function portion) 18 and a cathode layer (second electrode layer) 20 which are formed in this order on the anode layer 16.

<Anode Layer>

The anode layer 16 is provided on the substrate 12. An electrode exhibiting light transmittance is used for the anode layer 16. As the electrode exhibiting light transmittance, a thin film containing a metal oxide, a metal sulfide, and a metal having high electrical conductivity can be used, and a thin film having high light transmittance is suitably used. The anode layer 16 may have a network structure consisting of a conductor (for example, a metal). A thickness of the anode layer 16 can be determined in consideration of light transmittance, electric conductivity, and the like. The thickness of the anode layer 16 is generally 10 nm to 10 µm, preferably 20 nm to 1 µm, and more preferably 50 nm to 500 nm.

Examples of a material of the anode layer 16 include indium oxide, zinc oxide, tin oxide, indium tin oxide (abbreviation ITO), indium zinc oxide (abbreviation IZO), gold, platinum, silver, and copper. Among these, ITO, IZO, or tin oxide is preferable. The anode layer 16 can be formed in the form of a thin film consisting of the materials described above. As a material of the anode layer 16, organic materials such as polyaniline and derivatives thereof and polythiophene and derivatives thereof may be used. In this case, the anode layer 16 can be formed as a transparent conductive film.

<Organic EL Portion>

The organic EL portion 18 is a functional portion that contributes to light emission of the organic EL device 10 such as movement of charges and recombination of charges according to voltages applied to the anode layer 16 and the cathode layer 20. The organic EL portion 18 includes a hole injection layer 18a, a hole transport layer 18b, a light emitting layer 18c, an electron transport layer 18d, and an electron injection layer 18e in this order from the anode layer 16.

(Hole Injection Layer)

The hole injection layer 18a is a functional layer having a function of improving a hole injection efficiency from the anode layer 16 to the light emitting layer 18c. The hole injection layer 18a may be an inorganic layer or an organic layer. A hole injection material constituting the hole injection layer 18a may be a low molecular compound or a high molecular compound.

Examples of the low molecular compound include metal oxides such as vanadium oxide, molybdenum oxide, ruthenium oxide, and aluminum oxide, metal phthalocyanine compounds such as copper phthalocyanine, and carbon.

Examples of the high molecular compound include polythiophene derivatives such as polyaniline, polythiophene, and polyethylene dioxythiophene (PEDOT), polypyrrole, polyphenylene vinylene, polythienylene vinylene, polyquinoline, polyquinoxaline, and derivatives thereof; and a conductive polymer such as a polymer having an aromatic amine structure on a main chain or a side chain.

An optimal value of the thickness of the hole injection layer 18a is different depending on the material to be used. The thickness of the hole injection layer 18a is appropriately determined in consideration of properties to be required and the simplicity of film formation, for example. The thickness of the hole injection layer 18a is, for example, 1 nm to 1 µm, preferably 2 nm to 500 nm, and more preferably 5 nm to 200 nm.

(Hole Transport Layer)

The hole transport layer 18b is a functional layer having a function of receiving holes from the hole injection layer 18a (or the anode layer 16 in a case where there is no hole injection layer 18a) and of transporting the holes to the light emitting layer 18c.

The hole transport layer 18b is an organic layer containing a hole transport material. The hole transport material is not limited as long as the hole transport material is an organic compound having a hole transport function. Examples of the organic compound having the hole transport function include polyvinyl carbazole or derivatives thereof, polysilane or derivatives thereof, polysiloxane derivatives having an aromatic amine residue on a side chain or a main chain, pyrazoline derivatives, arylamine derivatives, stilbene derivatives, triphenyl diamine derivatives, polyaniline or derivatives thereof, polythiophene or derivatives thereof, polypyrrole or derivatives thereof, polyarylamine or derivatives thereof, poly(p-phenylene vinylene) or derivatives thereof, polyfluorene derivatives, a high molecular compound having an aromatic amine residue, and poly(2,5-thienylene vinylene) or derivatives thereof.

Examples of the hole transport material also include hole transport materials described in Japanese Unexamined Patent Publication No. S63-70257, Japanese Unexamined Patent Publication No. S63-175860, Japanese Unexamined Patent Publication No. H2-135359, Japanese Unexamined Patent Publication No. H2-135361, Japanese Unexamined Patent Publication No. H2-209988, Japanese Unexamined Patent Publication No. H3-37992, and Japanese Unexamined Patent Publication No. H3-152184.

An optimal value of the thickness of the hole transport layer 18b is different depending on the material to be used. The thickness of the hole transport layer 18b is appropriately determined in consideration of properties to be required, the simplicity of film formation, and the like. The hole transport layer 18b needs to have a thickness at least such that pinholes do not occur. A driving voltage of the organic EL device 10 may increase when the thickness of the hole transport layer is too thick. The thickness of the hole transport layer 18b is, for example, 1 nm to 1 µm, preferably 2 nm to 500 nm, and more preferably 5 nm to 200 nm.

(Light Emitting Layer)

The light emitting layer 18c is a functional layer having a function of emitting light (including visible light). In general, the light emitting layer 18c is an organic layer, and contains an organic substance emitting mainly at least one of fluorescence and phosphorescence, or the organic substance and a dopant material that aids the organic substance. The dopant material is added, for example, to improve a light-emitting efficiency or to change a light-emitting wavelength. The organic substance may be a low molecular compound or a high molecular compound. The thickness of the light emitting layer 18c is, for example, 2 nm to 200 nm.

Examples of the organic substance that is a light emitting material emitting mainly at least one of fluorescence and phosphorescence include dye-based materials, metal complex-based materials, and polymer-based materials.

(Dye-Based Material)

Examples of the dye-based material include cyclopentamine derivatives, tetraphenyl butadiene derivative compounds, triphenylamine derivatives, oxadiazole derivatives, pyrazoloquinoline derivatives, distyrylbenzene derivatives, distyryl arylene derivatives, pyrrole derivatives, thiophene ring compounds, pyridine ring compounds, perinone derivatives, perylene derivatives, oligothiophene derivatives, oxadiazole dimers, pyrazoline dimers, quinacridone derivatives, and coumarin derivatives.

(Metal Complex-Based Material)

Examples of the metal complex-based material include metal complexes which contain a rare earth metal such as Tb, Eu, and Dy, or Al, Zn, Be, Ir or Pt as a central metal and have oxadiazole, thiadiazole, phenylpyridine, phenylbenzimidazole, or quinoline structure as a ligand. Examples of the metal complexes include metal complexes emitting light from a triplet excited state such as iridium complexes and platinum complexes, aluminum quinolinol complexes, benzoquinolinol beryllium complexes, benzoxazolyl zinc complexes, benzothiazole zinc complexes, azomethyl zinc complexes, porphyrin zinc complexes, and phenanthroline europium complexes.

(Polymer-Based Material)

Examples of the polymer-based material include polyparaphenylene vinylene derivatives, polythiophene derivatives, polyparaphenylene derivatives, polysilane derivatives, polyacetylene derivatives, polyfluorene derivatives, polyvinylcarbazole derivatives, and materials in which the dye-based materials and the metal complex-based light emitting materials are polymerized.

(Dopant Material)

Examples of the dopant material include perylene derivatives, coumarin derivatives, rubrene derivatives, quinacridone derivatives, squarylium derivatives, porphyrin derivatives, styryl dyes, tetracene derivatives, pyrazolone derivatives, decacyclene, and phenoxazone.

(Electron Transport Layer)

The electron transport layer 18d is a functional layer having a function of receiving electrons from the electron injection layer 18e (or the cathode layer 20 when the electron injection layer 18e does not exist) and transporting the electrons to the light emitting layer 18c.

The electron transport layer 18d is an organic layer containing electron transport materials. Known materials can be used in the electron transport materials. Examples of the electron transport material constituting the electron transport layer 18d include: metal complexes of oxadiazole derivatives, anthraquinodimethane or derivatives thereof, benzoquinone or derivatives thereof, naphthoquinone or derivatives thereof; anthraquinone or derivatives thereof; tetracyanoanthraquinodimethane or derivatives thereof, fluorenone derivatives, diphenyldicyanoethylene or derivatives thereof; diphenoquinone derivatives, or 8-hydroxy quinoline or derivatives thereof; polyquinoline or derivatives thereof; polyquinoxaline or derivatives thereof; and polyfluorene or derivatives thereof.

A thickness of the electron transport layer 18d is appropriately determined in consideration of properties to be required and simplicity of film formation. The thickness of the electron transport layer 18d is, for example, 1 nm to 1 µm, preferably 2 nm to 500 nm, and more preferably 5 nm to 200 nm.

(Electron Injection Layer)

The electron injection layer 18e is a functional layer having a function of improving an electron injection efficiency from the cathode layer 20 to the light emitting layer 18c. The electron injection layer 18e may be an inorganic layer or an organic layer. An optimal material constituting the electron injection layer 18e is appropriately selected depending on the type of the light emitting layer 18c. Examples of the material constituting the electron injection layer 18e include an alkali metal, an alkali earth metal, an alloy containing at least one of the alkali metal and the alkali earth metal, an oxide, a halide, and a carbonate of the alkali metal or the alkali earth metal, or a mixture of such substances. Examples of the oxide, the halide, and the carbonate of the alkali metal or the alkali metal include lithium, sodium, potassium, rubidium, cesium, lithium oxide, lithium fluoride, sodium oxide, sodium fluoride, potassium oxide, potassium fluoride, rubidium oxide, rubidium fluoride, cesium oxide, cesium fluoride, and lithium carbonate. In addition, examples of the oxide, the halide, and the carbonate of the alkali earth metal or the alkali earth metal include magnesium, calcium, barium, strontium, magnesium oxide, magnesium fluoride, calcium oxide, calcium fluoride, barium oxide, barium fluoride, strontium oxide, strontium fluoride, and magnesium carbonate.

In addition, a layer obtained by mixing an organic material having electron transport properties that is known in the related art and an organic metal complex of an alkali metal can be used as the electron injection layer 18e.

The configuration of the organic EL portion 18 is not limited to the configuration shown in FIG. 1, and may have one or more functional layers. In other words, the organic EL portion 18 may have at least one functional layer in addition to the light emitting layer 18c. Examples of the layer configuration of the organic EL portion 18 are as follows. In the following examples of the layer configuration, the anode layer and the cathode layer are also described in parentheses in such a way to indicate an arrangement relation of the anode layer 16 and the cathode layer 20 with various functional layers.

(a) (anode layer)/hole injection layer/light emitting layer/(cathode layer)

(b) (anode layer)/hole injection layer/light emitting layer/electron injection layer/(cathode layer)

(c) (anode layer)/hole injection layer/light emitting layer/electron transport layer/electron injection layer/(cathode layer)

(d) (anode layer)/hole injection layer/hole transport layer/light emitting layer/(cathode layer)

(e) (anode layer)/hole injection layer/hole transport layer/light emitting layer/electron injection layer/(cathode layer)

(f) (anode layer)/hole injection layer/hole transport layer/light emitting layer/electron transport layer/electron injection layer/(cathode layer)

(g) (anode layer)/light emitting layer/electron injection layer/(cathode layer)

(h) (anode layer)/light emitting layer/electron transport layer/electron injection layer/(cathode layer)

The symbol "/" means that the layers on both sides of the symbol "/" are joined.

<Cathode Layer>

The cathode layer 20 is provided on the organic EL portion 18. The optimum value of the thickness of the cathode layer 20 differs depending on materials to be used. The thickness of the cathode layer 20 is set in consideration of electric conductivity, durability and the like. The thickness of the cathode layer 20 is generally 10 nm to 10 µm, preferably 20 nm to 1 µm, and more preferably 50 nm to 500 nm.

A material of the cathode layer 20 is preferable to have high reflectivity with respect to light (particularly, visible light) emitted from the light emitting layer 18c included in the organic EL portion 18 such that the light (specifically, the light emitted from the light emitting layer 18c) from the organic EL portion 18 is reflected by the cathode layer 20 and proceeds to the anode layer 16. Examples of the material of the cathode layer 20 include aluminum and silver. As the cathode layer 20, a transparent conductive electrode consisting of a conductive metal oxide, a conductive organic substance or the like may be used.

The organic EL device 10 may include a sealing member configured to prevent the organic EL portion 18 from deteriorating due to moisture. The sealing member can be provided on the cathode layer 20 in such a way as to seal at least the organic EL portion 18. In a case in which at least the organic EL portion 18 is sealed by the sealing member, for example, a part of the anode layer 16 and the cathode layer 20 can be pulled out from the sealing member for the purpose of external connection.

Figure 2:
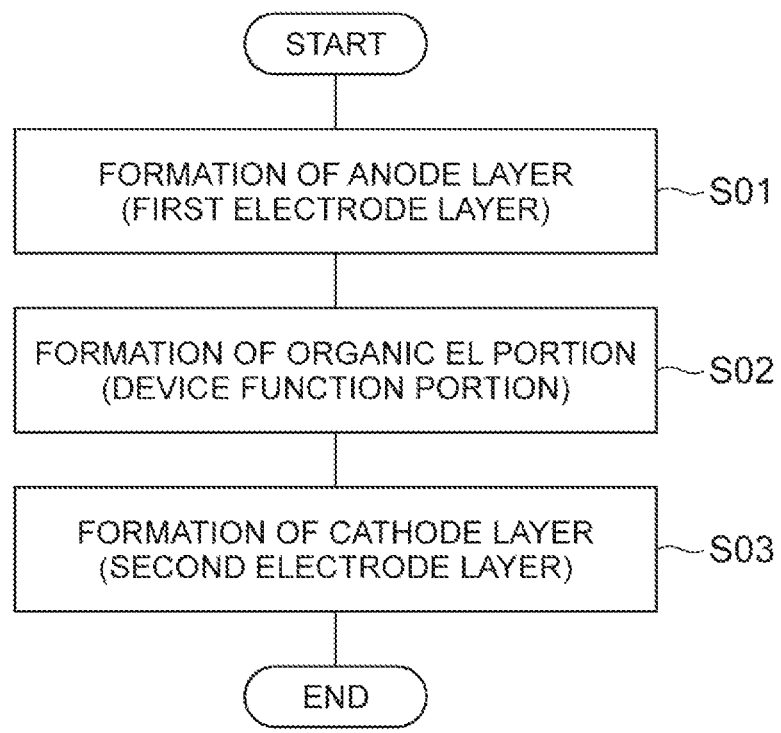
FIG. 2 is a flowchart showing an example of a method of manufacturing the organic EL device (organic electronic device) shown in FIG. 1.

The organic EL device 10 is manufactured in such a manner that a plurality of layers constituting the stack 14 are sequentially formed on the substrate 12. In other words, as shown in FIG. 2, a method of manufacturing the organic EL device 10 includes an anode layer (first electrode layer) forming step S01 of forming the anode layer 16 on the substrate 12, an organic EL portion (device function portion) forming step S02 of forming the organic EL portion 18 on the anode layer 16, and a cathode layer (second electrode layer) forming step S03 of forming the cathode layer 20 on the organic EL portion 18 which are sequentially performed. The organic EL device 10 is manufactured by performing the steps in this order.

In the organic EL portion forming step S02, one or more functional layers included in the organic EL portion 18 are formed in order from the anode layer 16. In the configuration of the organic EL portion 18 shown in FIG. 1, the hole injection layer 18a, the hole transport layer 18b, the light emitting layer 18c, the electron transport layer 18d, and the electron injection layer 18e are sequentially formed on the anode layer 16. In the embodiment in which the organic EL portion 18 has a single-layer structure (that is, in the embodiment in which the organic EL portion 18 is the light emitting layer 18c), the light emitting layer 18c is formed in the organic EL portion forming step S02.

At least one of the anode layer forming step S01, the organic EL portion forming step S02, and the cathode layer forming step S03 may be performed by a roll-to-roll method. In a case in which the organic EL device 10 is manufactured by using the roll-to-roll method, the band-shaped substrate 12 can be used for manufacturing the organic EL device 10. In this case, after a plurality of stacks 14 are formed at a plurality of predetermined positions of the band-shaped substrate 12, a region including the respective stacks 14 is diced into individual pieces, and thus individual organic EL devices 10 can be obtained. In a case in which the organic EL device 10 includes the sealing member that seals at least the organic EL portion 18, the sealing member may be provided on the substrate 12 subjected to the cathode layer forming step S03.

In the method of manufacturing the organic EL device 10, at least one of the plurality of layers constituting the stack 14 is formed by using an ink (coating solution) containing a material for a layer to be formed and a solvent with boiling point of 160° C. or more. An ink used in an inkjet printing method usually contains a solvent with boiling point of 160° C. or more in order to prevent clogging of an inkjet nozzle. Unless otherwise noted, a case of adopting an inkjet printing method as a coating method used to form a layer formed by using the ink containing the solvent with boiling point of 160° C. or more will be described below. However, as long as the layer is formed by using the ink containing the material for the layer to be formed and the solvent with boiling point of 160° C. or more, the coating method used to form the layer is not limited to the inkjet printing method.

Figure 3:
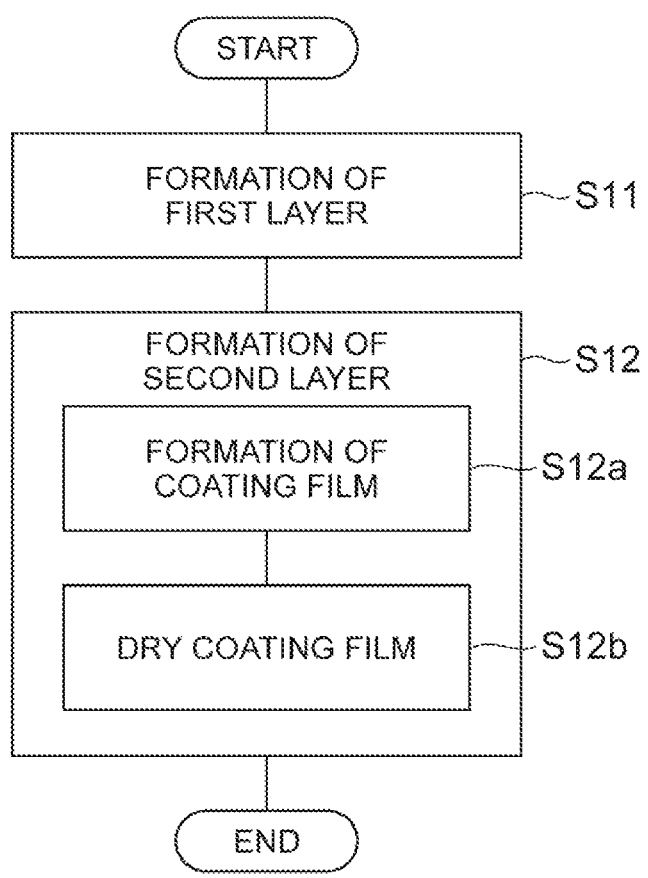
FIG. 3 is a flowchart for illustrating a first layer forming step and a second layer forming step included in the method of manufacturing the organic EL device.

Out of two layers that are included in the organic EL device 10 and that are adjacent to each other and in contact with each other, when a layer formed later by an inkjet printing method using an ink containing a solvent with boiling point of 160° C. or more is referred to as a second layer and a layer formed previously is referred to as a first layer, the method of manufacturing the organic EL device 10 includes a first layer forming step S11 and a second layer forming step S12 as shown in FIG. 3. Examples of the first layer and the second layer are the hole transport layer 18b and the light emitting layer 18c, respectively.

Layers other than the second layer may be formed by a dry film-formation method, or may be formed by coating methods other than the inkjet printing method. Examples of the dry film-formation method include a vacuum vapor deposition method, a sputtering method, an ion plating method, and a CVD method. Examples of the coating methods other than the inkjet printing method include a spin coating method, a slit coating method, a micro gravure coating method, a gravure coating method, a bar coating method, a roll coating method, a wire bar coating method, a spray coating method, a screen printing method, a flexography printing method, an offset printing method, and a nozzle printing method.

For example, when the stack 14 includes an A layer, a B layer, and a C layer and the B layer and the C layer are formed by the inkjet printing method, the A layer and the B layer correspond to the first layer and the second layer, respectively, in a set of the A layer and the B layer; and the B layer and the C layer correspond to the first layer and the second layer, respectively, in a set of the B layer and the C layer. In other words, when the layer corresponding to the first layer corresponds to the second layer in relation to another layer, the layer corresponding to the first layer can be formed by the inkjet printing method. The A layer is, for example, the anode layer 16, the hole injection layer 18a, the hole transport layer 18b, or the light emitting layer 18c. In a case in which the organic EL portion 18 has the layer configuration shown in FIG. 1 (the configuration of the above configuration example (f)), for example, the B layer and the C layer are the hole injection layer 18a and the hole transport layer 18b, respectively, when the A layer is the anode layer 16; the B layer and the C layer are the hole transport layer 18b and the light emitting layer 18c, respectively, when the A layer is the hole injection layer 18a, the B layer and the C layer are the light emitting layer 18c and the electron transport layer 18d, respectively, when the A layer is the hole transport layer 18b; and the B layer and the C layer are the electron transport layer 18d and the electron injection layer 18e, respectively, when the A layer is the light emitting layer 18c. The examples of the B layer and the C layer are described herein in the case where the A layer is the anode layer 16, the hole injection layer 18a, the hole transport layer 18b, or the light emitting layer 18c, but the examples are similar in a case where the A layer is another layer. The C layer may be the cathode layer 20. In a case in which the organic EL portion 18 has the layer configuration (the configuration of the above configuration example (f)) shown in FIG. 1, for example, the A layer and the B layer are the electron transport layer 18d and the electron injection layer 18e, respectively, when the C layer is the cathode layer 20. When the anode layer 16 has a multilayer structure, for example, the C layer may be the hole injection layer 18a, the hole transport layer 18b, or the light emitting layer 18c depending on the layer configuration of the organic EL portion 18.

<First Layer Forming Step>

Figure 4:
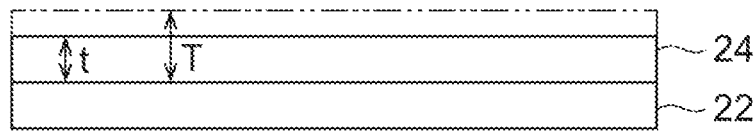
FIG. 4 is a view for illustrating the first layer forming step.

In the first layer forming step S11, a first layer 24 is formed on a base member 22 as shown in FIG. 4. The base member 22 is a member on which the first layer 24 is to be formed, and is a member including the substrate 12 and at least one layer formed before the first layer forming step S11. When the organic EL portion 18 has the configuration shown in FIG. 1 and the first layer 24 is the hole transport layer 18b, the base member 22 is a member in which the anode layer 16 and the hole injection layer 18a are formed on the substrate 12. In FIG. 4, the base member 22 is schematically shown. In the first layer forming step S11, the first layer 24 is formed to have a thickness t.

The first layer 24 may be formed by the coating method or the dry film-formation method as described above. When the first layer 24 is formed by the coating method, a material for forming the first layer 24 may have a crosslinking group. The material having a crosslinking group may be a material itself for the first layer 24 having a crosslinking group, or may be a material containing a material itself for the first layer 24 not having a crosslinking group and a crosslinking agent having a crosslinking group.

<Second Layer Forming Step>

Figure 5:
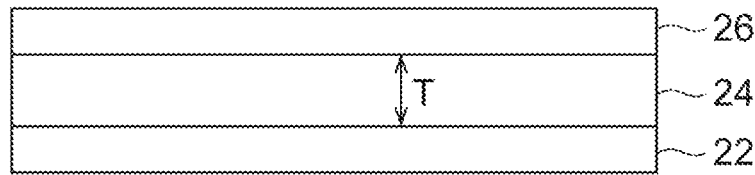
FIG. 5 is a view showing a stacked structure of the first layer and the second layer after the second layer forming step.

In the second layer forming step S12, a second layer 26 is formed on the first layer 24 as shown in FIG. 5. In the second layer forming step S12, the second layer 26 is formed by an inkjet printing method. Specifically, the second layer forming step S12 includes a coating film forming step S12a and a drying step S12b as shown in FIG. 3. The method of forming the second layer 26 is not limited to the inkjet printing method as long as the layer is formed by using the ink containing the material for the layer to be faulted and the solvent with boiling point of 160° C. or more as described above.

(Coating Film Forming Step)

In the coating film forming step S12a, an ink (coating solution) containing a material to be the second layer 26 and a solvent with boiling point of 160° C. or more is coated from the inkjet nozzle onto the first layer 24, thereby forming a coating film. The solvent contained in the ink is a solvent that dissolves the material of the second layer 26.

Examples of the solvent with boiling point of 160° C. or more include:

aliphatic hydrocarbon solvents such as n-decane, n-undecane, decalin, n-dodecane, n-tetradecane, and bicyclohexyl;

aromatic hydrocarbon solvents such as mesitylene, 1,2,4-trimethylbenzene, o-diethylbenzene, m-diethylbenzene, p-diethylbenzene, n-butylbenzene, sec-butylbenzene, isobutylbenzene, tert-butylbenzene, n-pentylbenzene, n-hexylbenzene, n-heptylbenzene, n-octylbenzene, n-nonylbenzene, n-decylbenzene, dodecylbenzene, 1,3-diisopropylbenzene, 1,4-diisopropylbenzene, cyclohexylbenzene, tetralin, and biphenyl;

aliphatic alcohol solvents such as 1-heptanol, 1-octanol, 2-octanol, cyclohexanol, 1-methylcyclohexanol, 2-methylcyclohexanol, 2,6-dimethylcyclohexanol, 2,3-dimethylcyclohexanol, cyclohexanol, cyclohexylmethanol, tetrahydrofurfuryl alcohol, 2-nonanol, 1-nonanol, n-decanol, 2-decanol, n-undecanol, isodecanol, and n-tetradecanol;

aromatic alcohol solvents such as phenol, o-cresol, o-ethylphenol, m-cresol, p-cresol, p-ethylphenol, 4-methoxyphenol, o-n-propylphenol, o-isopropylphenol, o-sec-butylphenol, o-tert-butylphenol, m-tert-butylphenol, p-tert-butylphenol, and benzyl alcohol;

polyhydric alcohol solvents such as ethylene glycol, propylene glycol, hexylene glycol, diethylene glycol, ethylene glycol mono-2-ethylhexyl ether, ethylene glycol monobutyl ether, ethylene glycol monohexyl ether, ethylene glycol monobenzyl ether, dipropylene glycol, tripropylene glycol, 1,3-butanediol, 1,4-butanediol, neopentyl glycol, 1,5-pentanediol, and 1,6-hexanediol;

aliphatic ester solvents such as dimethyl succinate, diethyl oxalate, dimethyl oxalate, dimethyl malonate, diethyl malonate, n-octyl acetate, and diethyl succinate;

aromatic ester solvents such as methyl benzoate, ethyl benzoate and n-butyl benzoate;

ketone solvents such as methylcyclohexanone, diisobutyl ketone, 2-(1-cyclohexenyl) cyclohexanone, and isophorone;

aliphatic ether solvents such as ethylene glycol diethyl ether, triethylene glycol dimethyl ether, and tetraethylene glycol dimethyl ether;

aromatic ether solvents such as ethyl phenyl ether, 2-methylanisole, 3-methylanisole, 4-methylanisole, 2,5-dimethylanisole, 2-ethylanisole, 4-ethylanisole, n-butyl phenyl ether, t-butylanisole, n-pentylanisole, n-hexylanisole, n-heptylanisole, n-octylanisole, 1-methyl naphthyl ether, 2-methyl naphthyl ether, diphenylether, and 3-phenoxytoluene;

solvents containing nitrogen atoms such as N,N-dimethylacetamide, acetamide, N-methylpyrrolidone, and 2-pyrrolidone; and solvents containing sulfur atoms such as dimethyl sulfoxide, thiodiglycol, and sulfolane.

The boiling point of the solvent is preferably 170° C. or more, and more preferably 180° C. or more in order to prevent drying of the inkjet nozzle.

Example of the solvent with boiling point of 180° C. or more include:

aliphatic hydrocarbon solvents such as n-undecane, decalin, n-dodecane, n-tetradecane, and bicyclohexyl;

aromatic hydrocarbon solvents such as o-diethylbenzene, m-diethylbenzene, p-diethylbenzene, n-butylbenzene, n-pentylbenzene, n-hexylbenzene, n-heptylbenzene, n-octylbenzene, n-nonylbenzene, n-decylbenzene, dodecylbenzene, 1,3-diisopropylbenzene, 1,4-diisopropylbenzene, cyclohexylbenzene, tetralin, and biphenyl;

aliphatic alcohol solvents such as 1-octanol, 2,3-dimethylcyclohexanol, cyclohexanol, cyclohexylmethanol, 2-nonanol, 1-nonanol, n-decanol, 2-decanol, n-undecanol, isodecanol, and n-tetradecanol;

aromatic alcohol solvents such as phenol, o-cresol, o-ethylphenol, m-cresol, p-cresol, p-ethylphenol, 4-methoxyphenol, o-n-propylphenol, o-isopropylphenol, o-sec-butylphenol, o-tert-butylphenol, m-tert-butylphenol, p-tert-butylphenol, and benzyl alcohol;

polyhydric alcohol solvents such as ethylene glycol, propylene glycol, hexylene glycol, diethylene glycol, ethylene glycol mono-2-ethylhexyl ether, ethylene glycol monohexyl ether, ethylene glycol monobenzyl ether, dipropylene glycol, tripropylene glycol, 1,3-butanediol, 1,4-butanediol, neopentyl glycol, 1,5-pentanediol, and 1,6-hexanediol;

aliphatic ester solvents such as dimethyl succinate, diethyl oxalate, diethyl malonate, n-octyl acetate, and diethyl succinate;

aromatic ester solvents such as methyl benzoate, ethyl benzoate and n-butyl benzoate;

ketone solvents such as 2-(1-cyclohexenyl) cyclohexanone and isophorone;

aliphatic ether solvents such as triethylene glycol dimethyl ether and tetraethylene glycol dimethyl ether;

aromatic ether solvents such as 2,5-dimethylanisole, 2-ethylanisole, 4-ethylanisole, n-butyl phenyl ether, t-butylanisole, n-pentylanisole, n-hexylanisole, n-heptylanisole, n-octylanisole, 1-methyl naphthyl ether, 2-methyl naphthyl ether, diphenylether, and 3-phenoxytoluene;

solvents containing nitrogen atoms such as acetamide, N-methylpyrrolidone, and 2-pyrrolidone; and solvents containing sulfur atoms such as dimethyl sulfoxide, thiodiglycol, and sulfolane.

The above ink may contain two or more solvents with boiling point of 160° C. or more, or may contain a solvent with boiling point of 160° C. or more and a solvent with boiling point of less than 160° C. In other words, the above ink only needs to contain a solvent with boiling point of 160° C. or more. The above ink contains the solvent with boiling point of 160° C. or more, the content of the solvent being preferably 10% or more and 100% or less and more preferably 20% or more and 100% or less.

(Drying Step)

In the drying step S12b, the coating film formed in the coating film forming step S12a is dried, and thus the second layer 26 is obtained. The drying step S12b may be performed on, for example, the first layer 24, on which the coating film is formed, carried in a drying furnace. Examples of the drying furnace include a reduced-pressure drying furnace and a drying furnace equipped with an infrared heater. When the organic EL device 10 is manufactured by a continuous carrying process such as a roll-to-roll process, in the drying step S12b, it is preferable that the coating film be dried by using the drying furnace equipped with an infrared heater while carrying the substrate 12 on which the first layer 24 is formed. An inside pressure of the drying furnace is preferably 0.1 Pa or more and 1000 Pa or less, and more preferably 1 Pa or more and 100 Pa or less. A drying time is preferably 10 seconds or more and 30 minutes or less, and more preferably 30 seconds or more and 30 minutes or less.

In the first layer forming step S11, assuming that a thickness of the first layer 24 is defined as T when the organic EL device 10 is designed as indicated by a two-dot chain line in FIG. 4, the first layer 24 is formed with a thickness t smaller than the thickness T. The thickness t is a thickness set such that the thickness of the first layer 24 has the thickness T after the second layer forming step S12 as shown in FIG. 5 in consideration of the amount of increase in the thickness of the first layer 24 during the formation of the second layer 26. For example, the thickness t can be 0.9 T or less.

The thickness T is a design value at which a desired light-emitting efficiency (desired performance) is obtained in the organic EL device 10, that is, a desired thickness. The thickness T can be a thickness at which a desired light-emitting efficiency is obtained when the organic EL device is manufactured under the same conditions except that, for example, the second layer 26 is formed by an ink (hereinafter, referred to as a "reference ink") which contains the material for the second layer 26 and in which a boiling point of a solvent is less than 160° C. and by a coating method (for example, a spin coating method) depending on the reference ink. The thickness T may be a design value of the first layer 24 when the organic EL device is manufactured under the same conditions except that, for example, the second layer 26 is formed by using the reference ink and by a coating method depending on the reference ink. In the description, the "ink (coating solution) in which the boiling point of the solvent is less than 160° C." is an ink (coating solution) not containing the solvent with boiling point of 160° C. or more. In other words, even when the ink in which the boiling point of the solvent is less than 160° C. contains a plurality of types of solvents, the boiling points of all kinds of solvents are less than 160° C.

Examples of solvent with boiling point of less than 160° C. include:

aliphatic hydrocarbon solvents such as n-octane, n-nonan, methylcyclohexane, 1,2-dimethylcyclohexane, ethylcyclohexane, cycloheptane, and n-tridecane;

aromatic hydrocarbon solvents such as toluene, o-xylene, p-xylene, m-xylene, ethylbenzene, n-propylbenzene, and isopropylbenzene;

aliphatic alcohol solvents such as 1-butanol, 1-pentanol, 2-pentanol, 1-hexanol, 2-hexanol, and cyclopentanol;

polyhydric alcohol solvents such as ethylene glycol monoethyl ether, ethylene glycol monomethyl ether, propylene glycol monomethyl ether, and triethylene glycol;

aliphatic ester solvents such as n-butyl formate, allyl acetate, n-butyl acetate, methyl lactate, ethyl lactate, methyl pyruvate, and ethyl pyruvate;

ketone solvents such as cyclopentanone, cyclohexanone, methyl isobutyl ketone, and diisopropyl ketone;

aliphatic ether solvents such as dibutyl ether, dioxane, and tetrahydrofuran;

aromatic ether solvent such as anisole; and solvents containing nitrogen atoms such as N,N-dimethylformamide and N,N-diisopropylethylamine.

The thickness t may be calculated such that the thickness of the first layer 24 has the thickness T after the second layer forming step S12, based on a change rate in the thickness (swelling ratio) of the first layer 24 theoretically obtained with respect to the first layer 24, or the thickness t may be obtained by experiment for optimizing the thickness t.

Figure 6:
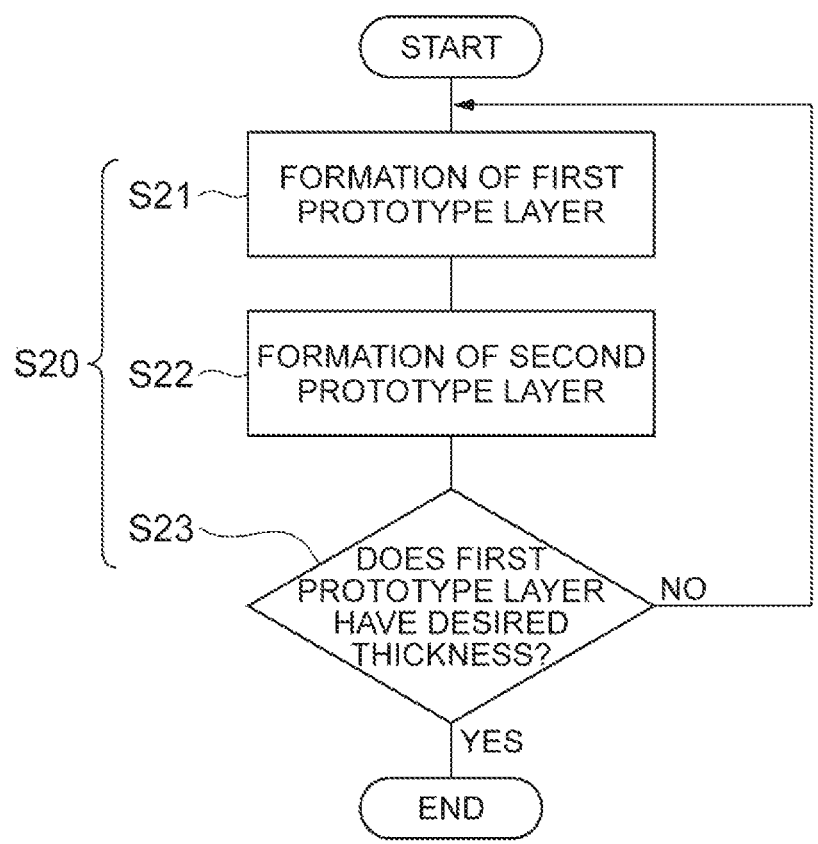
FIG. 6 is a flowchart showing an example of a preparation step.

In the case in which the thickness t is obtained experimentally, the method of manufacturing the organic EL device 10 may further include a preparation step S20 for optimizing the thickness t, as shown in FIG. 6. In the case of including the preparation step S20, a manufacturing method indicated by the flowchart shown in FIG. 2 may be performed as a product manufacturing step of manufacturing the organic EL device 10 as a product by using the thickness t obtained in the preparation step S20. In this case, the method of manufacturing the organic EL device 10 includes the preparation step S20, and the product manufacturing step including an anode layer forming step S01, an organic EL portion forming step S02 and a cathode layer forming step S03. It is enough that the preparation step S20 is performed before performing a step corresponding to the first layer forming step S11 in the product manufacturing step. The preparation step S20 may be performed once as long as the organic EL device 10 is manufactured under the same conditions.

In the embodiment, the preparation step S20 includes a first prototype layer forming step S21, a second prototype layer forming step S22, and a determination step S23.

(First Prototype Layer Forming Step)

In the first prototype layer forming step S21, a first prototype layer is formed on a prototype support body by using the same material as the first layer 24. The support body may be the base member 22 described in the first layer forming step S11.

(Second Prototype Layer Forming Step)

In the second prototype layer forming step S22, a second prototype layer is formed on the first prototype layer by an ink (coating solution) used to form the second layer 26. A method and conditions of forming the second prototype layer are the same as in the second layer 26. Accordingly, when the second layer 26 is formed by the inkjet printing method, the second prototype layer is also formed by the inkjet printing method.

(Determination Step)

In the determination step S23, it is determined whether the first prototype layer after the second prototype layer forming step S22 has a desired thickness T. Whether the first prototype layer has the desired thickness T may be determined by, for example, actually measuring the thickness of the first prototype layer.

When the result of the determination step S23 indicates that the first prototype layer does not have the desired thickness ("NO" in FIG. 6), the process returns to the first prototype layer forming step S21, the thickness of the first prototype layer is changed, and the first prototype layer forming step S21 is performed again. When the result of the determination step S23 indicates that the first prototype layer has the desired thickness T ("YES" in FIG. 6), the preparation step S20 is ended.

Therefore, the first prototype layer forming step S21 and the second prototype layer forming step S22 are repeated in the preparation step S20 while changing the thickness of the first prototype layer formed in the first prototype layer forming step S21 until the thickness of the first prototype layer reaches the desired thickness T.

In a case where the base member 22 described in the first layer forming step S11 is used as a support body in the first prototype layer forming step S21, for example, the organic EL device may be manufactured as a test product by performing the steps subsequent to the second layer forming step S12 in the product manufacturing step under the same conditions as the product manufacturing step after the second prototype layer forming step S22. In this case, a light-emitting efficiency of the organic EL device serving as a test product may be measured in the determination step S23, and a state in which a desired light-emitting efficiency is obtained may be determined as a desired thickness of the first prototype layer.

The preparation step S20 may include a calculation step of calculating the thickness t of the first layer 24 to be formed in the first layer forming step S11, instead of the determination step S23. In the calculation step, the thickness t of the first layer 24 is calculated with respect to the desired thickness T, based on a thickness change rate (swelling ratio) of the first prototype layer calculated based on the thickness of the first prototype layer formed in the first prototype layer forming step S21 and the thickness of the first prototype layer after the second prototype layer forming step S22.

The thickness T of the first layer 24 may be set as follows. In other words, before the product manufacturing step, a test product manufacturing step of manufacturing a plurality of test organic EL devices (test products) under the same conditions as the product manufacturing step except that a thickness of a corresponding layer corresponding to the first layer 24 to be formed in the first layer forming step S11 is changed and an evaluation step of evaluating the plurality of test organic electronic devices are performed. Light-emitting efficiencies of the plurality of test organic EL devices are evaluated in the evaluation step, and, in the manufacturing of the test organic EL device with which desired light-emitting efficiency is obtained, the thickness of the corresponding layer may be set as the thickness t of the first layer 24 to be formed in the first layer forming step S11. In such an embodiment, the test product manufacturing step and the evaluation step may be an example of the preparation step S20.

In the method of manufacturing the organic EL device according to the embodiment, at least one of the sets of two layers adjacent to each other and constituting the stack 14 is formed by performing the first layer forming step S11 and the second layer forming step S12 shown in FIG. 3.

In the second layer forming step S12, the second layer 26 is formed by using the ink containing the solvent with boiling point of 160° C. or more. The ink containing the solvent with boiling point of 160° C. or more is slower in drying than the case where the reference solvent is used, for example. Therefore, when the ink for the second layer 26 is coated onto the first layer 24, the solvent easily permeates into the first layer 24 until the ink is dried. Accordingly, the first layer 24 swells, and the thickness of the first layer 24 increases from the time when the first layer 24 is formed.

Accordingly, if the first layer 24 is formed with the desired thickness T at the time of forming the first layer, since the thickness of the first layer 24 in the manufactured organic EL device is thicker than the desired thickness T, the organic EL device can hardly realize a desired light-emitting efficiency.

On the other hand, in the first layer forming step S11 of the embodiment, the first layer 24 is formed with a thickness t in which an increase in the thickness of the first layer 24 as the second layer 26 is formed is anticipated. For this reason, even when the second layer 26 is formed of the ink containing the solvent with boiling point of 160° C. or more, the organic EL device 10 including the first layer 24 having the desired thickness T can be manufactured. As a result, a desired light-emitting efficiency (desired performance) can be realized in the manufactured organic EL device 10. When the first layer 24 and the second layer 26 are the functional layers that constitute the organic EL portion 18, the change in thickness tends to affect the performance (particularly, the light-emitting efficiency) of the organic EL device 10. Accordingly, when the functional layers constituting the organic EL portion 18 are formed, it is effective to perform the first layer forming step S11 and the second layer forming step S12 shown in FIG. 3. In particular, it is effective when the first layer 24 is the hole transport layer 18b and the second layer 26 is the light emitting layer 18c.

When the ink contains the solvent with boiling point of 160° C. or more, the content of the solvent being preferably 10% or more, and more preferably 20% or more, the thickness change rate of the first layer 24 as the second layer 26 is formed is likely to be large. Therefore, the method of manufacturing the organic EL device is more effective in the case in which the ink contains the solvent with boiling point of 160° C. or more, the content of the solvent being preferably 10% or more and 100% or less, and more preferably 20% or more and 100% or less.

The operational effect of forming the first layer 24 with the thickness t smaller than the desired thickness T in the first layer forming step S11 will be described in detail based on the experimental results. Elements corresponding to the elements described above are denoted by the same reference numerals as those described above, and the contents and results of the experiment will be described.

In the experiment, six organic EL devices D1, D2, D3, D4, D5, and D6 having the configuration shown in FIG. 1 were manufactured. In the manufacture of the organic EL devices D1 to D6, the hole transport layer 18b was the first layer 24, and the light emitting layer 18c was the second layer 26.

(Manufacture of Organic EL Devices D1 to D3)

In the manufacture of the organic EL devices D1 to D3, the first layer 24 was formed with a thickness of 15 nm, 20 nm, and 30 nm, respectively, at the time of forming the first layer 24 (the hole transport layer 18b). These thicknesses of the first layer 24 are the thickness of the first layer 24 before the formation of the second layer 26 (the light emitting layer 18c). In the organic EL devices D1 to D3, the second layer 26 was coated onto the first layer 24 by a spin coating method using a reference ink containing the material (the material of the light emitting layer 18c) for the second layer 26 and a solvent including mixed xylene (mixture of o-xylene (boiling point: 144° C.), m-xylene (boiling point: 139° C.), p-xylene (boiling point: 138° C.)). Immediately after the coating of the reference ink, the reference ink was already dried. After the coating of the reference ink, the substrate 12 on which the coating film was formed was heated and dried at a temperature of 130° C. for 10 minutes by using a hot plate under normal pressure, thereby obtaining the second layer 26. The organic EL devices D1 to D3 were manufactured under the same conditions except that the thickness of the first layer 24 was different.

(Manufacturing of Organic EL Devices D4 to D6)

In the organic EL devices D4 to D6, as in the case of the organic EL devices D1 to D3, the first layer 24 was formed with a thickness of 15 nm, 20 nm, and 30 nm, respectively, at the time of forming the first layer 24 (the hole transport layer 18b). These thicknesses of the first layer 24 are the thickness of the first layer 24 before the formation of the second layer 26 (the light emitting layer 18c). In the organic EL devices D4 to D6, the second layer 26 was coated onto the first layer 24 by an inkjet printing method using an ink containing the material for the second layer 26 (the material of the light emitting layer 18c) and a solvent with boiling point of 230° C. or more. Immediately after the coating of the ink, the ink was not dried. After the coating of the ink, the substrate 12 on which the coating film is formed is dried at a pressure of 10 Pa for 5 minutes and further heated and dried at a temperature of 130° C. for 10 minutes by using a hot plate under normal pressure, thereby obtaining the second layer 26. The organic EL devices D4 to D6 were manufactured under the same conditions as in the case of the organic EL devices D1 to D3, except that the solvent of the ink used to form the second layer 26 and the method of faulting the second layer 26 were different.

(Light-Emitting Efficiencies of Organic EL Devices D1 to D6)

Figure 7:
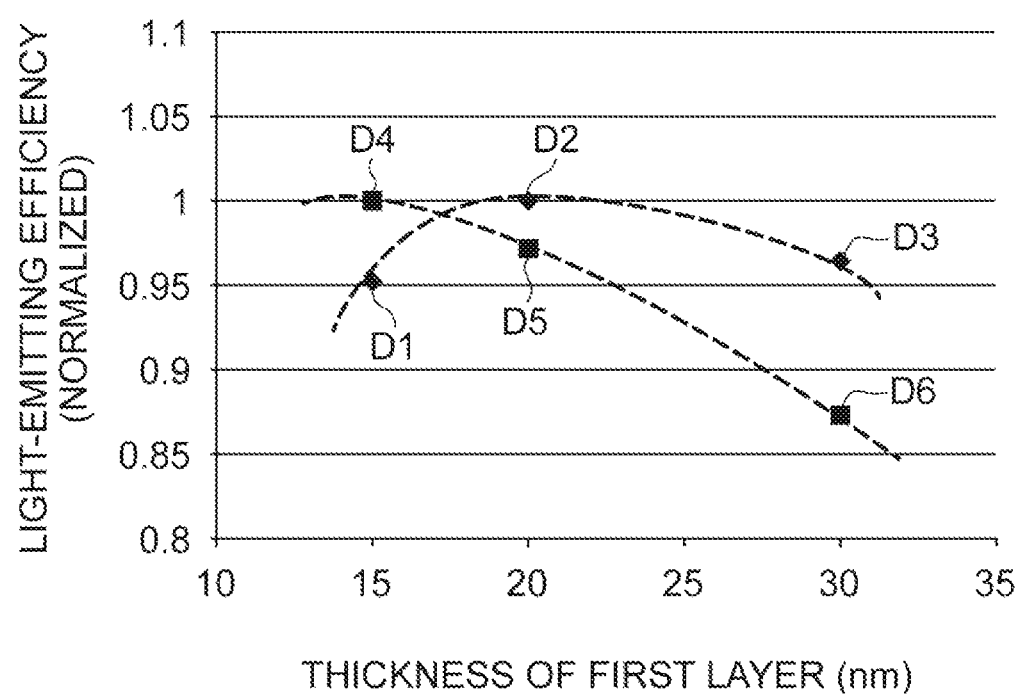
FIG. 7 is a view showing an experimental result for illustrating a case where a first thickness at the time of forming the first layer is formed smaller than a desired thickness.

The light-emitting efficiencies of the organic EL devices D1 to D6 were measured under the same conditions. The measurement results were as shown in FIG. 7. In FIG. 7, the abscissa indicates the thickness of the first layer 24 at the time of forming the first layer. In other words, the abscissa corresponds to the thickness t. In FIG. 7, the ordinate indicates a light-emitting efficiency obtained by normalizing the light-emitting efficiencies of the organic EL devices D1 to D3 by the maximum light-emitting efficiency.

As shown in FIG. 7, among the organic EL devices D1 to D3 in which the second layer 26 was formed by using the reference ink, the organic EL device D2 in which the first layer 24 was formed with a thickness of 20 nm has the maximum light-emitting efficiency, and the organic EL device D1 in which the thickness of the first layer 24 was thinner than 20 nm and the organic EL device D3 in which the thickness of the first layer 24 was thicker than 20 nm have a lower light-emitting efficiency than the organic EL device D2.

Since the organic EL devices D1 to D3 and the organic EL devices D4 to D6 were manufactured under the same conditions except for the solvent of the ink used to form the second layer 26 and the method of forming the second layer 26 according thereto, the same light-emitting efficiency is expected. However, as shown in FIG. 7, the light-emitting efficiencies of the organic EL device D4 out of the organic EL devices D4 to D6 and the organic EL device D2 were substantially equal to each other, but the light-emitting efficiencies of the organic EL devices D5 and D6 were lower than that of the corresponding organic EL devices D2 and D3.

This is considered to be due to the reason described above. In other words, when the second layer 26 is formed by using the ink containing the solvent with boiling point of 160° C. or more, the time required for drying the solvent of the used ink becomes longer compared with the solvent of the reference ink. Accordingly, the time during which the solvent stays on the first layer 24 becomes longer. As a result, it is considered that the thickness t of the first layer 24 increases as the first layer 24 swells. Accordingly, the first layer 24 is formed with a desired thickness T, for example, a thickness smaller than the thickness at which a desired light-emitting efficiency is obtained when the second layer 26 is formed by using the reference ink, and thus the organic EL device capable of achieving a desired light-emitting efficiency can be manufactured. The desired light-emitting efficiency may be a level required as a product, and is 99% or more, for example. In this case, for example, it is preferable that the thickness t of the first layer 24 formed in the first layer forming step S11 be 0.9 T or less with respect to the desired thickness T, and may be 0.75 T or less, for example. A lower limit of the thickness t is a thickness (about 5 nm) that can be formed by the inkjet printing method when the first layer 24 is formed by the inkjet printing method, for example.

In a case in which the method of manufacturing the organic EL device 10 includes, for example, the preparation step S20 shown in FIG. 6, the thickness t of the first layer 24 formed in the first layer forming step S11 can be experimentally obtained in the preparation step S20. In the manufactured organic EL device 10, therefore, the first layer 24 can be formed with the thickness T at which a desired value is obtained as the light-emitting efficiency of the organic EL device 10. Before manufacturing the organic EL device 10 as a product, a plurality of test organic EL devices (test products) are manufactured and evaluated as described above.

Various embodiments of the present invention have been described above. However, the present invention is not limited to the various embodiments. The present invention is intended to cover the scope defined by claims, and to include meanings equivalent to claims and all modifications as would fall within the scope of the present invention.

The manufacturing method illustrated in FIG. 2 includes the anode layer forming step S01, the organic EL portion forming step S02, and the cathode layer forming step S03. However, for example, when a substrate on which the anode layer is formed in advance is prepared, the anode layer forming step S01 is not necessary, and it is enough that the method of manufacturing the organic EL device includes the organic EL portion forming step S02 and the cathode layer forming step S03.

Although the case where the first electrode layer is the anode layer and the second electrode layer is the cathode layer is described, the first electrode layer may be the cathode layer and the second electrode layer may be the anode layer.

The present invention is also applicable to an organic electronic device other than the organic EL device, for example, an organic solar cell, an organic photodetector, and an organic transistor.

REFERENCE SIGNS LIST 10 organic EL device (organic electronic device)
12 substrate
14 stack
16 anode layer (first electrode layer)
18 organic EL portion (device function portion)
18a hole injection layer (functional layer)
18b hole transport layer (functional layer, first layer)
18c light emitting layer (functional layer, second layer)
18d electron transport layer (functional layer)
18e electron injection layer (functional layer)
20 cathode layer (second electrode layer)
22 base member
24 first layer
26 second layer

The invention claimed is:

1. A method of manufacturing an organic electronic device including a stack including a first electrode layer, one or more functional layers, and a second electrode layer, the one or more functional layers and the second electrode layer being formed in this order on the first electrode layer, the method comprising:
a first layer forming step of forming a first layer among the layers included in the stack; and
a second layer forming step of forming a second layer on the first layer by using a coating solution containing a material for the second layer and a solvent with boiling point of 160° C. or more, the second layer being in contact with the first layer, wherein
in the first layer forming step, the first layer is formed with a thickness smaller than a desired thickness such that the first layer has the desired thickness due to an increase in a thickness of the first layer as the second layer is formed.

2. The method according to claim 1, wherein at least one of the one or more functional layers is the first layer.

3. The method according to claim 1, wherein the second layer is formed by using an inkjet printing method in the second layer forming step.

4. The method according to claim 1, further comprising:
a preparation step of optimizing the thickness of the first layer formed in the first layer forming step, wherein
in the first layer forming step, the first layer is formed with the thickness of the first layer optimized in the preparation step.

5. The method according to claim 4, wherein the preparation step includes:
a first prototype layer forming step of forming a first prototype layer by using the same material as the first layer;
a second prototype layer forming step of forming a second prototype layer on the first prototype layer with the coating solution; and
a determination step of determining whether the first prototype layer has the desired thickness after the second prototype layer forming step,
the first prototype layer forming step and the second prototype layer forming step being repeated while changing a thickness of the first prototype layer formed in the first prototype layer forming step until the first prototype layer has the desired thickness as a result of the determination step.

6. The method according to claim 4, wherein the preparation step includes:
a first prototype layer forming step of forming a first prototype layer by using the same material as the first layer;
a second prototype layer forming step of forming a second prototype layer on the first prototype layer with the coating solution; and
a calculation step of calculating the thickness of the first layer to be formed in the first layer forming step with respect to the desired thickness, based on a thickness change rate of the first prototype layer calculated based on a thickness of the first prototype layer formed in the first prototype layer forming step and a thickness of the first prototype layer after the second prototype layer forming step.

7. The method according to claim 1, further comprising:
a device function portion forming step of forming a device function portion on the first electrode layer by forming the one or more functional layers on the first electrode layer formed on a substrate; and
a second electrode layer forming step of forming the second electrode layer on the device function portion, wherein
the device function portion forming step includes the first layer forming step and the second layer forming step.

8. The method according to claim 1, further comprising:
a product manufacturing step of manufacturing an organic electronic device as a product, the product manufacturing step including the first layer forming step and the second layer forming step;
a test product manufacturing step of manufacturing, before the product manufacturing step, a plurality of test organic electronic devices under the same conditions as in the product manufacturing step except that a thickness of a corresponding layer corresponding to the first layer formed in the first layer forming step is changed; and
an evaluation step of evaluating, before the product manufacturing step, the plurality of test organic electronic devices, wherein
one of the one or more functional layers is a light emitting layer,
in the evaluation step, light-emitting efficiencies of the plurality of test organic electronic devices are evaluated, and
in the product manufacturing step, the first layer forming step is performed with the thickness of the corresponding layer used for manufacturing a test organic electronic device in which a desired light-emitting efficiency is obtained from among the plurality of test organic electronic devices in the evaluation step.

* * * * *